United States Patent [19]
Sonntag

[11] 4,318,046
[45] Mar. 2, 1982

[54] DIGITAL FREQUENCY DIVIDER

[75] Inventor: Fritz Sonntag, Munich, Fed. Rep. of Germany

[73] Assignee: Siemens Aktiengesellschaft, Berlin & Munich, Fed. Rep. of Germany

[21] Appl. No.: 86,156

[22] Filed: Oct. 18, 1979

[30] Foreign Application Priority Data

Nov. 16, 1978 [DE] Fed. Rep. of Germany ....... 2849797

[51] Int. Cl.³ ........................................... H03K 21/00
[52] U.S. Cl. ................................ 328/39; 307/225 R; 328/41
[58] Field of Search ............................ 328/39, 41, 48; 307/225 R, 471; 364/703

[56] References Cited

U.S. PATENT DOCUMENTS

| | | | |
|---|---|---|---|
| 3,906,374 | 9/1975 | Fletcher et al. | 328/41 |
| 4,041,403 | 8/1977 | Chiapparoli, Jr. | 307/225 R X |
| 4,223,268 | 9/1980 | Shimizu | 328/48 |

FOREIGN PATENT DOCUMENTS

| | | |
|---|---|---|
| 2753398 | 4/1979 | Fed. Rep. of Germany . |
| 2753453 | 4/1979 | Fed. Rep. of Germany . |
| 2005882 | 9/1978 | United Kingdom . |
| 2013944 | 12/1978 | United Kingdom . |
| 2013946 | 12/1978 | United Kingdom . |

OTHER PUBLICATIONS

Hobbs, Divide-By-N Uses Shift Register, EDN Oct. 5, 1976, p. 108.

*Primary Examiner*—Eugene R. LaRoche
*Attorney, Agent, or Firm*—Hill, Van Santen, Steadman, Chiara & Simpson

[57] ABSTRACT

A digital frequency divider, for producing an output signal related in frequency to an input signal by the ratio less than unity Z/N, incorporates an exclusive-OR gate and three frequency dividers having divisors m, n and k. The fraction Z/N is realized where n and k are integers, and the divisor m is chosen by:

$$m = \frac{Z}{Z \cdot n - \frac{N}{k}}$$

When m is not an integral number, its corresponding divider is embodied by a cascaded divider circuit made up of two or more cascaded units each including an exclusive-OR gate and at least two frequency dividers connected to yield a fractional divisor.

6 Claims, 3 Drawing Figures

$$\frac{Z}{N} = \frac{5}{27} \; : \; m = \frac{5}{5 \cdot n - \frac{27}{k}} \qquad \begin{array}{l} k = 3 \\ n = 2 \\ m = 5 \end{array}$$

$$\frac{Z}{N} = \frac{50}{1987} \; : \; m = \frac{50}{50 \cdot n - \frac{1987}{k}} \qquad \begin{array}{l} k = 1 \\ n = 40 \\ m = \frac{50}{13} = \frac{Z}{Z'} \end{array}$$

$$\frac{Z'}{Z} = \frac{13}{50} \; : \; m' = \frac{13}{13 \cdot n' - \frac{50}{k'}} \qquad \begin{array}{l} k' = 2 \\ n' = 2 \\ m' = 13 \end{array}$$

4,318,046

DIGITAL FREQUENCY DIVIDER

FIELD OF THE INVENTION

This invention relates to a digital frequency divider, and more particularly to such a divider which can accomplish division according to a ratio Z/N < 1.

THE PRIOR ART

It is frequently necessary to generate signals which are not integral multiples of any available pilot frequency. Such frequencies are derived from available frequencies by means of division, multiplication, and mixing. Often, division and multiplication are both required, so that the final frequency is a fraction Z/N of the starting frequency, where Z is less than N.

It is desirable to produce the desired frequency with the maximum amount of energy available at the desired frequency, and as little as possible energy contained in nearby harmonics of a sub-frequency.

Heretofore, it has been proposed to employ relatively complicated divider logic circuits which function to produce signals at a required frequency by counting different widths of pulses and spaces between pulses. Especially, when the fraction contains relatively large numbers in the numerator and denominator, the previous methods result in relatively large amounts of circuitry. It is therefore desirable to provide a simplified digital frequency divider.

BRIEF DESCRIPTION OF THE INVENTION

It is a principal object of the present invention to provide a digital frequency divider which can produce a frequency related to a starting frequency by a ratio less than unity of Z/N.

According to one embodiment of the present invention, a digital frequency divider is provided in which a signal having the frequency to be divided is connected to an input of an exclusive-OR gate, the output of the exclusive-OR gate being connected to the input of a first frequency divider having the divisor n, and with the output of the first frequency divider being connected to the input of a second frequency divider having the divisor m, and with the output of the second frequency divider connected to the second input of the exclusive-OR gate. A signal with a divided frequency is available at the output of the first divider, and may be further divided if desired by a third divider having the divisor k.

By proper selection of the divisors m, n and k, one may obtain a signal which has a desired fractional relation to the frequency of the input signal with relatively little complexity. Conventional circuits are used for the several dividers, which, when driven with a symmetrical square input, yield a square wave output in which the pulse-space ratio is 1:1.

In another embodiment of the present invention, the second frequency divider is realized by the provision of an exclusive-OR gate and two further frequency dividers, to provide a fractional divisor for the second frequency divider. In this way, exceedingly precise frequency divisions may take place, in which the relation of the output frequency to the input frequency is a fraction having very large numbers in the numerator and/or denominator, with relatively simple and uncomplicated apparatus.

In another embodiment of the present invention, one or more of the dividers are programmable, so that the division ratios are responsive to program divisors.

Other objects and advantages of the present invention will become manifest by an examination of the following description and the accompanying drawings.

BRIEF DESCRIPTION OF THE DRAWINGS

Reference will now be made to the accompanying drawings in which:

Referring now to FIG. 1, an embodiment of the present invention is shown which empolys an exclusive-OR gate 1 and three dividers 2, 3 and 4. The dividers 2, 3 and 4 affect integral division with the divisors n, m and k, respectively. A signal with the starting frequency is applied via a line E to one input of the exclusive-OR gate 1, and the output of the gate 1 is connected to the input of the divider 2. The output of the divider 2 is connected to inputs of the other two dividers 3 and 4, and the output of the diver 3 is connected to the other input of the exclusive-OR gate 1. The output of the divider 4 furnishes a signal on the line A which has a frequency which is fractionally related to the frequency of the input signal on the line E. Preferably, the input signal applied to the line E is a square wave, and the output signal available on line A is also substantially square, i.e., the mark-space ratio is essentially 1:1. The signal available on the output line A contains a relatively large amount of energy at the desired frequency, and the proportion of the total energy available at this frequency can be calculated by means of Fourier analysis. Harmonics of sub-frequencies which are not desired are greatly attenuated.

When the overall divisor ratios are to be Z/N, the divisors of the individual frequency dividers are related by the formula:

$$m = \frac{Z}{Z \cdot n - \frac{N}{k}}$$

Figure 1:
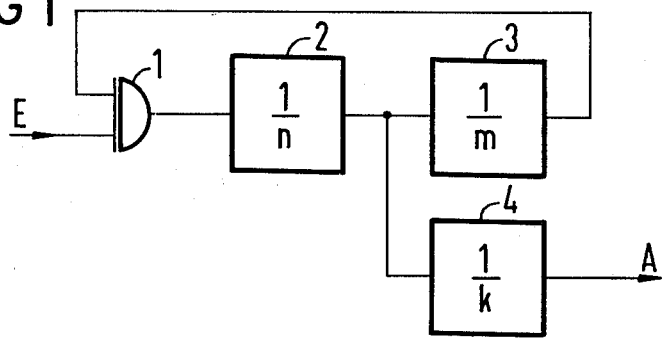
FIG. 1 is a functional block diagram showing an illustrative embodiment of the present invention.
Figure 2:
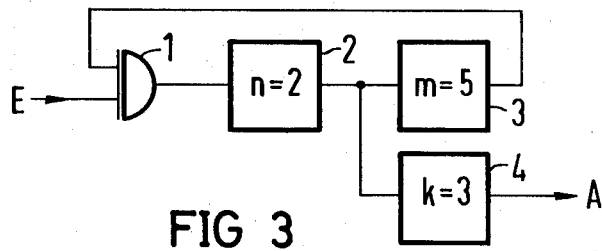
FIG. 2 is a functional block diagram of a specific embodiment for realizing the divider ratio 5/27.

In FIG. 2, a practical embodiment of the present invention is illustrated, in which a ratio Z/N=5/27. The divisor k is selected equal to 3, and n is selected equal to 2. The divisor m, calculated by the formula given above, gives a divisor of 5. Accordingly, when the dividers 2, 3 and 4 of FIG. 1 have divisors 2, 5 and 3, respectively, the output signal on the line A is related to the input signal by the fraction 5/27. It is apparent that by the relatively simple circuit of FIG. 1, one can obtain relatively complex frequency division functions, by appropriate selection of the divisors for the three dividers. In some cases, where k equals 1, the divider 4 may be omitted.

Figure 3:
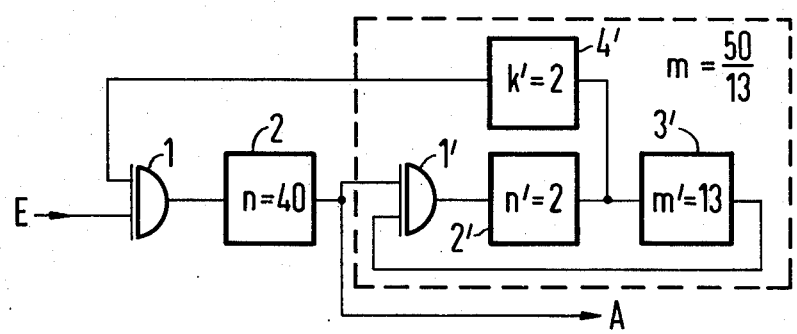
FIG. 3 is another embodiment of the present invention for realizing the divider ratio 50/1987.

FIG. 3 illustrates an arrangement in which the divisor m is itself a fraction. In the arrangement of FIG. 3, the simple frequency divider 3 of FIG. 1 is replaced by a divider circuit contained within the dashed rectangle 3, which is constructed in a manner identical to the whole of FIG. 1. The exclusive-OR gate and dividers 1', 2', 3' and 4' correspond exactly to their counterparts of FIG. 1. Similarly, the exclusive-OR gate 1 and the divider 2 correspond identically to the exclusive-OR gate 1 and divider 2 of FIG. 1. In the arrangement of FIG. 3, the divisor n equals 40, and the divisor k equals 1. Accordingly, no further divider is required to be connected in series with the output line A. The divisor for m is required to be 50/13. Accordingly, the divider 3'' is constructed so as to produce an output signal related to the input signal by the reciprocal 13/50. When the divisors k' and n' are chosen equal to 2, the formula given above gives m' equal to 13. The result, at the output line A, is the required division ratio of 50/1987.

In the event that a desired frequency division ratio does not yield an integral number for m', the divider 3' is again replaced by the circuit of FIG. 1. If this does not result in a circuit in which all of the individual dividers have integral divisors, the divider corresponding to the divider 3 of FIG. 1 is again replaced by the circuit of FIG. 1, and this process is repeated until one obtains a divider circuit in which all of the dividers have whole number divisors.

While the divider circuit of the present invention can sometimes be constructed without the employment of the divider 4, frequently, the use of this divider permits an essential simplification of the total frequency divider arrangement, by limiting the number of cascade stages which must be employed in order to obtain a circuit with integral divisors for all dividers.

It is apparent from the foregoing that the present invention offers an extremely simple and economical method of effecting relatively complicated frequency divisions. Various additions and modifications may occur to those skilled in the art without departing from the essential features of novelty of the present invention, which are intended to be defined and secured by the appended claims.

What is claimed is:

1. A digital frequency divider for dividing an input frequency to produce an output frequency at an output terminal related to the input frequency by the fraction less than unity Z/N; comprising an exclusive-OR gate having one input connected to receive a signal at said input frequency, a first frequency divider having a divisor n connected to the output of said exclusive-OR gate, a second frequency divider having a divisor m connected to the output of said first frequency divider, the output of said second frequency divider being connected to a second input of said exclusive-OR gate, and a third frequency divider having a divisor k connected to the output of said first frequency divider and to said output terminal for producing an output signal at said output terminal, each of said frequency dividers providing an output signal at its respective output with a pulse-space ratio of 1=1, the divisors n and k being integral numbers, and m being determined by:

$$m = \frac{Z}{Z \cdot n - \frac{N}{k}}$$

2. Apparatus according to claim 1, wherein at least one of said first, second, and third frequency dividers comprises a programmable frequency divider.

3. Apparatus according to claim 1, wherein said second frequency divider comprises a circuit having its input connected to one input of a second exclusive-OR gate, a fourth frequency divider connected to the output of said second exclusive-OR gate, a fifth frequency divider connected to receive the output of said fourth frequency divider, and having its output connected to a second input of said second exclusive-OR gate, and a sixth frequency divider connected to receive the output of said fourth frequency divider and having its output connected to the second input of the first exclusive-OR gate, whereby said second frequency divider has a fractional divisor.

4. Apparatus according to claim 1, wherein said second frequency divider comprises a cascaded series of identical frequency divider units with the counterpart of said second frequency divider in each unit comprising a further exclusive-OR gate and at least two frequency dividers connected in the same manner in which the first exclusive-OR gate is connected with said first and second frequency dividers.

5. A method for dividing an input frequency to produce an output frequency related to the input frequency by the fraction less than unity Z/N, comprising the steps of connecting a signal at said input frequency to an input of an exclusive-OR gate, connecting the output of said exclusive-OR gate to a first frequency divider having a divisor n, connecting the output of said first frequency divider to a second frequency divider having a divisor m, connecting the output of said second frequency divider to a second input of said exclusive-OR gate, connecting the output of said first frequency divider to a third frequency divider having a divisor k, employing, for each of said first, second and third frequency dividers, a unit providing an output signal with a pulse-space ratio of 1:1, whereby the output frequency is produced at the output of said third frequency divider, and choosing the divisor of said second frequency divider by $$m = \frac{Z}{Z \cdot n - \frac{N}{k}}$$

6. The method according to claim 5, including the step of employing, when m is a fraction greater than unity, for said second frequency divider a divider circuit having its input connected to a second exclusive-OR gate, the output of said second exclusive-OR gate being connected to a fourth frequency divider having a divisor n', the output of said fourth frequency divider being connected to a fifth frequency divider having a divisor m', the output of said fifth frequency divider being connected to a second input of said second exclusive-OR gate, and the output of said fourth frequency divider being connected as the output of said second frequency divider circuit, and choosing the divisor of said fifth divider by:

$$m' = \frac{Z'}{Z' \cdot n' - N'}$$

where 1/m equals Z'/N'.

* * * * *